(12) United States Patent
Parekh et al.

(10) Patent No.: US 6,894,332 B2
(45) Date of Patent: May 17, 2005

(54) APPARATUS FOR REDUCING ELECTRICAL SHORTS FROM THE BIT LINE TO THE CELL PLATE

(75) Inventors: Kunal R. Parekh, Boise, ID (US); Charles H. Dennison, Meridian, ID (US); Jeffrey W. Honeycutt, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 6 days.

(21) Appl. No.: 09/943,778

(22) Filed: Aug. 30, 2001

(65) Prior Publication Data

US 2002/0031875 A1 Mar. 14, 2002

Related U.S. Application Data

(62) Division of application No. 09/399,592, filed on Sep. 20, 1999.

(51) Int. Cl.[7] .................. H01L 27/108; H01L 29/76; H01L 29/94; H01L 31/119
(52) U.S. Cl. ............... 257/296; 257/303; 257/306
(58) Field of Search ................. 438/239, 253, 438/254, 396, 397; 257/296, 300, 303, 304, 306, 307, 308, 309, 310

(56) References Cited

U.S. PATENT DOCUMENTS

| | | | |
|---|---|---|---|
| 5,338,700 A | 8/1994 | Dennison et al. | 438/253 |
| 5,563,089 A | 10/1996 | Jost et al. | 438/396 |
| 5,686,747 A | 11/1997 | Jost et al. | 257/296 |
| 5,763,306 A * | 6/1998 | Tsai | 438/255 |
| 5,821,140 A | 10/1998 | Jost et al. | 438/241 |
| 5,946,568 A | 8/1999 | Hsiao et al. | |
| 6,124,626 A * | 9/2000 | Sandhu et al. | 257/532 |
| 6,162,737 A | 12/2000 | Weimer et al. | |
| 6,200,855 B1 | 3/2001 | Lee | 438/255 |
| 6,243,285 B1 | 6/2001 | Kurth et al. | |
| 6,274,423 B1 * | 8/2001 | Prall et al. | 438/239 |
| 6,300,667 B1 | 10/2001 | Miyamoto | |
| 6,323,080 B1 | 11/2001 | Parekh | |
| 6,376,301 B2 | 4/2002 | Parekh et al. | |
| 6,399,982 B1 * | 6/2002 | Derderian et al. | 257/309 |
| 6,482,245 B2 | 12/2002 | Liu et al. | |
| 6,524,907 B2 | 2/2003 | Parekh et al. | |

* cited by examiner

*Primary Examiner*—Hoai Pham
(74) *Attorney, Agent, or Firm*—TraskBritt

(57) ABSTRACT

A stress buffer and dopant barrier in the form of a Tetra-EthylOrthoSilicate (TEOS) film is deposited after the capacitor cell plate has been etched and cleaned to thereby eliminate electrical shorts from the bit line to the cell plate.

20 Claims, 10 Drawing Sheets

APPARATUS FOR REDUCING ELECTRICAL SHORTS FROM THE BIT LINE TO THE CELL PLATE

CROSS-REFERENCE TO RELATED APPLICATION

This application is a divisional of application Ser. No. 09/399,592, filed Sep. 20, 1999, now U.S. Pat. No. 6,468,859, issued Oct. 22, 2002.

TECHNICAL FIELD OF THE INVENTION

This invention relates generally to the formation of a bit line over a capacitor array of memory cells.

BACKGROUND OF THE INVENTION

This invention was principally motivated in addressing problems and improvements in dynamic random access memory (DRAM). As DRAM increases in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics, as well as the cell structure, is important.

Conventional stacked capacitor DRAM arrays utilize either a Capacitor Over Bit line (COB) or a Capacitor Under Bit line (CUB) construction. With a Capacitor Over Bit line construction, the bit line is provided in close vertical proximity to the bit line contact of the memory cell field effect transistor (FET), with the cell capacitors being formed over the top of the word line and bit line. With a Capacitor Under Bit line construction, a deep vertical bit line contact is made through a thick insulating layer to the source/drain region of the cell FET access transistor, with the capacitor construction being provided over the word line and under the bit line.

The present invention relates to a method of reducing electrical shorts between the bit contact and the capacitor cell plate in a Capacitor Under Bit line cell.

SUMMARY OF THE INVENTION

The process of the present invention provides a method to prevent a short circuit between a capacitor cell plate and a conductive contact. The present invention provides for a capacitor structure having lower and upper conductive cell plates. The conductive cell plates are separated by a dielectric and the conductive cell plates and the dielectric have exposed edges. A layer of TEOS is disposed upon the wafer and about the capacitor structure. The TEOS layer encases the exposed edges of the conductive cell plates. A conductive contact structure is then provided adjacent the capacitor structure. The TEOS layer separates the capacitor structure and the conductive contact structure, thereby preventing the conductive structures from shorting together.

BRIEF DESCRIPTION OF THE SEVERAL VIEWS OF THE DRAWINGS

The present invention will be better understood from reading the following description of nonlimitative embodiments, with reference to the attached drawings, wherein.

DETAILED DESCRIPTION OF THE INVENTION

FIGS. 1–10 illustrate a technique for eliminating electrical shorts in a semiconductor device. It should be understood that the illustrations are not meant to be actual cross-sectional views of any particular semiconductor device, but are merely idealized representations which are employed to more clearly and fully depict the formation of the process of the present invention than would otherwise be possible.

Figure 1:
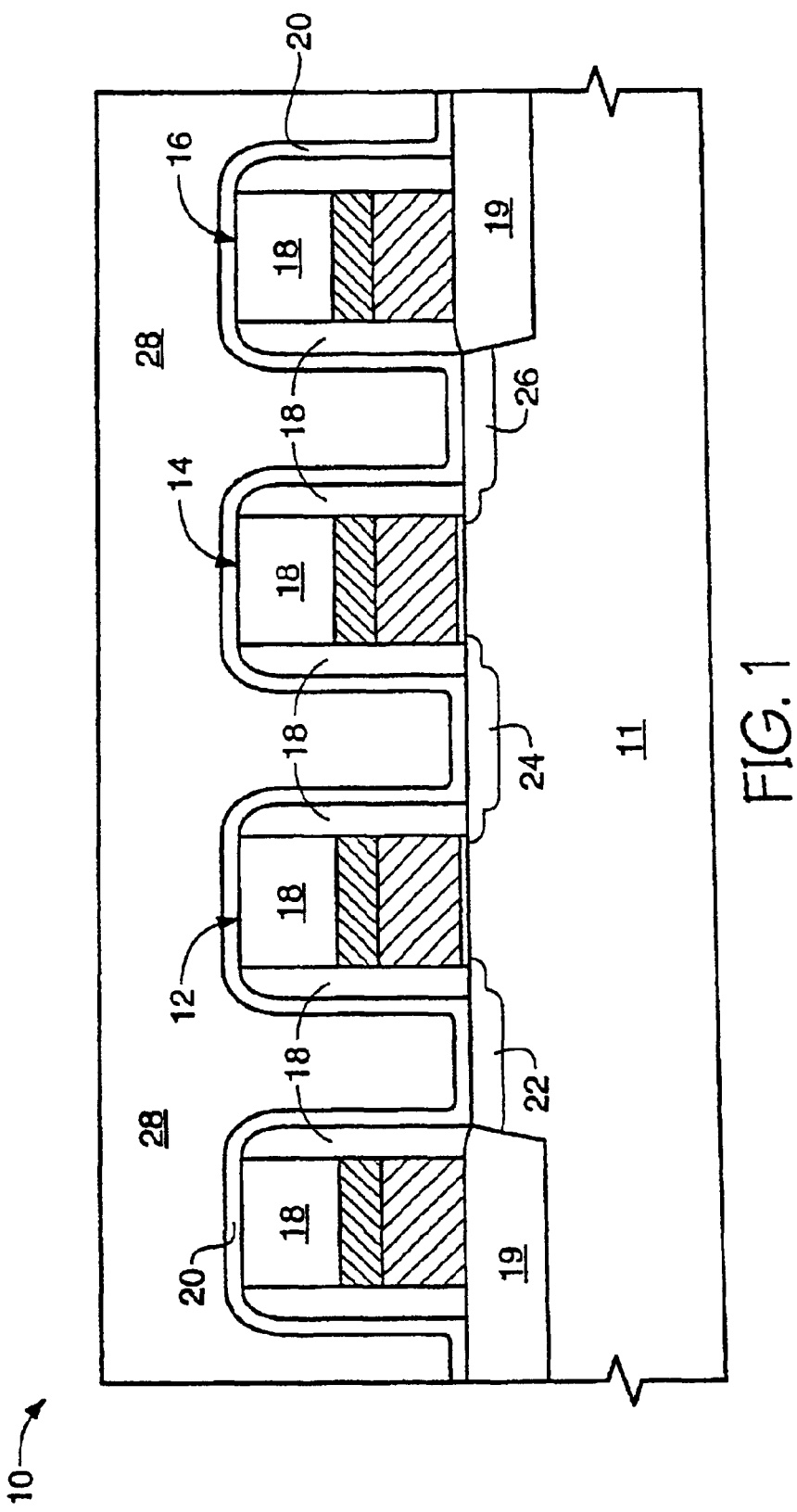
FIG. 1 is a schematic cross-section of a semiconductor wafer fragment, in accordance with the process of the present invention.

Referring to FIG. 1, a semiconductor wafer fragment is indicated generally as a wafer 10. Wafer 10 is defined in part by a silicon semiconductor substrate 11. In the semiconductor industry, a "substrate" refers to one or more semiconductor layers or structures, which includes active or operable portions of semiconductor devices. In the context of this document, the term "semiconductor substrate" is defined to mean any construction comprising semiconductive material including, but not limited to, bulk semiconductive material, such as a semiconductive substrate, either alone or in assemblies comprising other materials thereon, and semiconductive material layers, either alone or in assemblies comprising other materials. The term "substrate" refers to any supporting structure including, but not limited to, the semiconductive substrates described above.

Wafer 10 has been provided with an array of substantially electrically isolated word lines, such as the illustrated word lines 12, 14, and 16. Such word lines are of a conventional construction having a lowermost gate oxide, a lower polysilicon layer, an overlying silicide layer such as tungsten silicide, and insulating caps 18 and side insulating spacers. Such spacers and caps 18 preferably comprise an insulative nitride, such as $Si_3N_4$. A thin layer 20 of $Si_3N_4$ or TetraEthylOrthoSilicate (TEOS) is provided atop the wafer to function as a diffusion barrier for subsequent BoroPhosphoSilicate Glass (BPSG) deposition. Layer 20 has a thickness preferably from about 100 Angstroms to about 250 Angstroms.

Active areas are provided about the word lines, such as active regions 22, 24, and 26, to define an array of memory cell FETs. The discussion proceeds with reference to FETs formed using word lines 12 and 14, which would be provided with a capacitor construction for definition of two memory cells which share the same bit line contact. Active regions 22 and 26 define first active regions for electrical connection with a memory cell capacitor (described below). Active region 24 defines a second active region for electrical connection with a bit line (described below). Field oxide 19 is provided, as shown.

A first insulating layer 28 is provided over the word lines and active areas. An example material is BoroPhosphoSilicate Glass (BPSG), with an example deposition thickness being between 15,000 and 20,000 Angstroms. Preferably, as shown, layer 28 is subsequently planarized by chemical-mechanical polishing (CMP) to an elevation of from about 2,000 Angstroms to about 8,000 Angstroms above the word line nitride caps 18.

Figure 2:
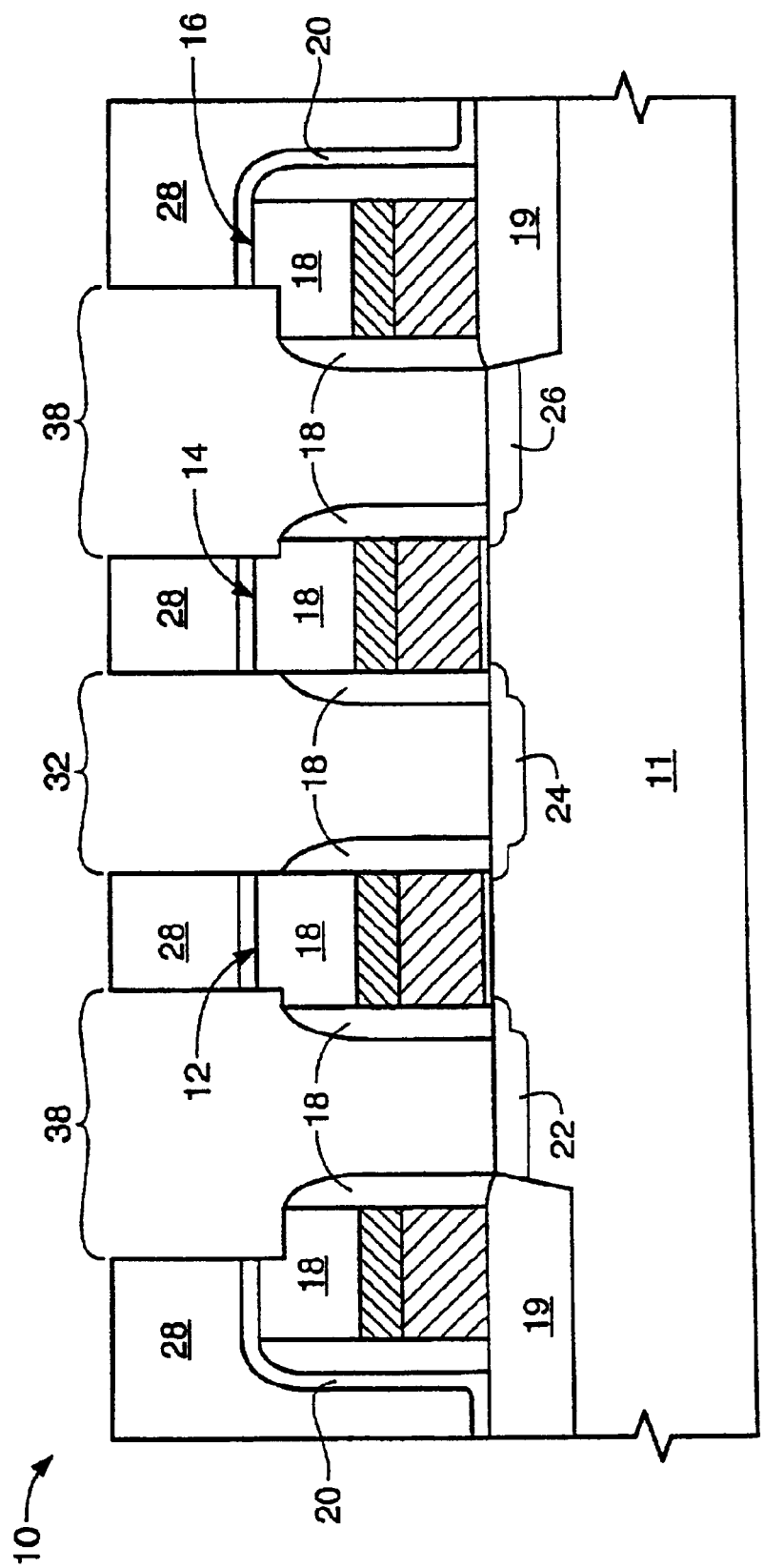
FIG. 2 is a schematic cross-section of the semiconductor wafer fragment, in accordance with the process of the present invention.

Referring to FIG. 2, a series of first contact openings 38 and second contact openings 32 are provided through first insulating layer 28 to first active regions 22 and 26 and second active region 24, respectively. Selective photomasking and dry chemical etching of BPSG selectively relative to nitride would typically form such contact openings. An example etch chemistry would include $CHF_3$ and $O_2$ at low $O_2$ flow rate (i.e., less than 5% $O_2$ by volume in a $CHF_3/O_2$ mixture), or the combination of $CF_4$, Argon, $CH_2F_2$ and $CHF_3$.

Thereafter, a selective etch of the wafer is conducted to etch nitride layer 20 or TEOS relative to underlying silicon substrate 11 to upwardly expose active regions 22, 24 and 26. The principal purpose of the nitride or TEOS layer 20 is to prevent diffusion of boron or phosphorous atoms from first insulating layer 28 into active areas 22, 24 and 26. Caps 18 are preferably comprised of a nitride ($Si_3N_4$) and layer 28 comprised of an oxide, such that the contact etch to produce contact openings 32 and 38 will stop relative to word line spacers and caps 18.

Figure 3:
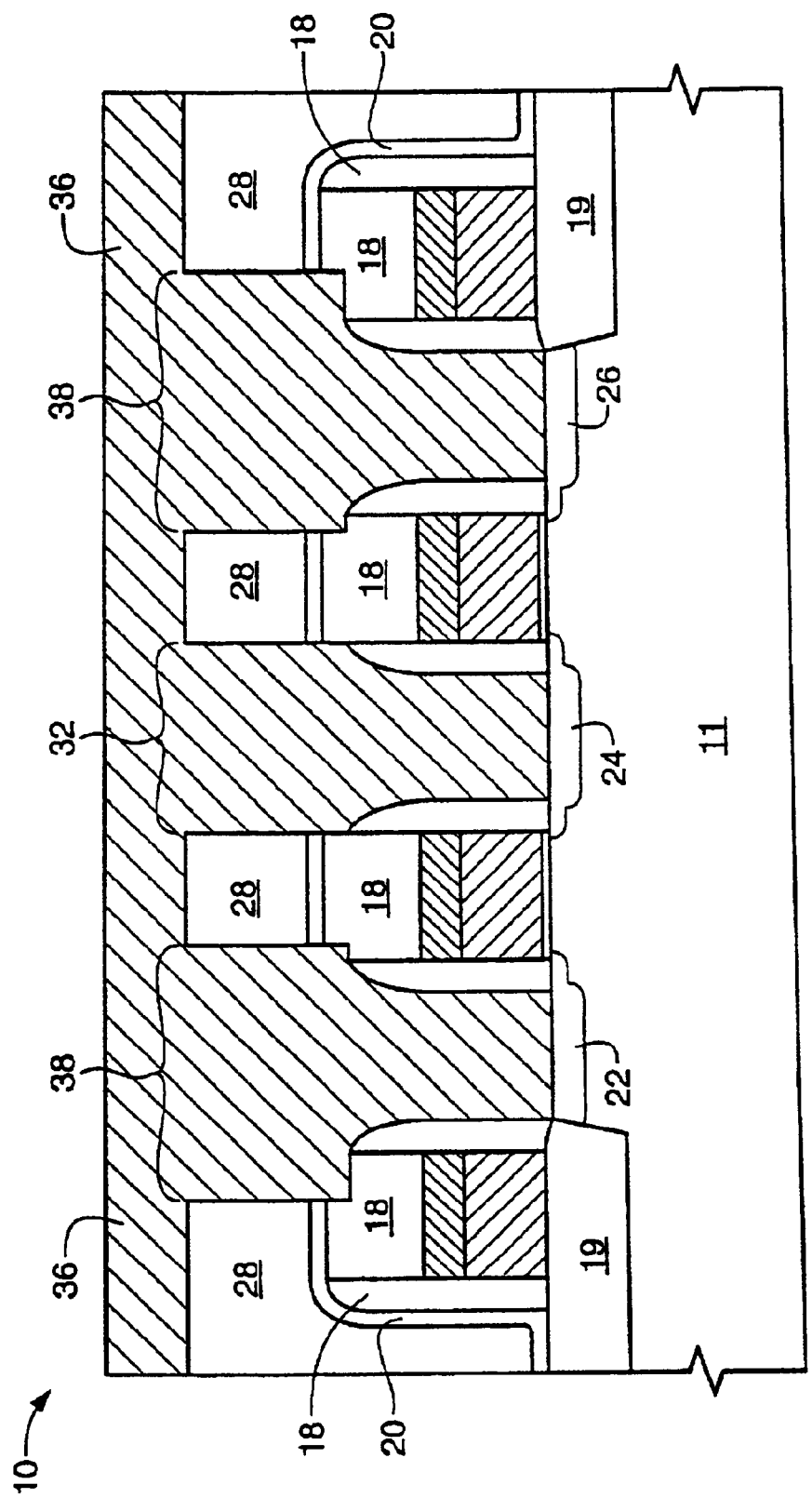
FIG. 3 is a schematic cross-section of the semiconductor wafer fragment, in accordance with the process of the present invention.
Figure 4:
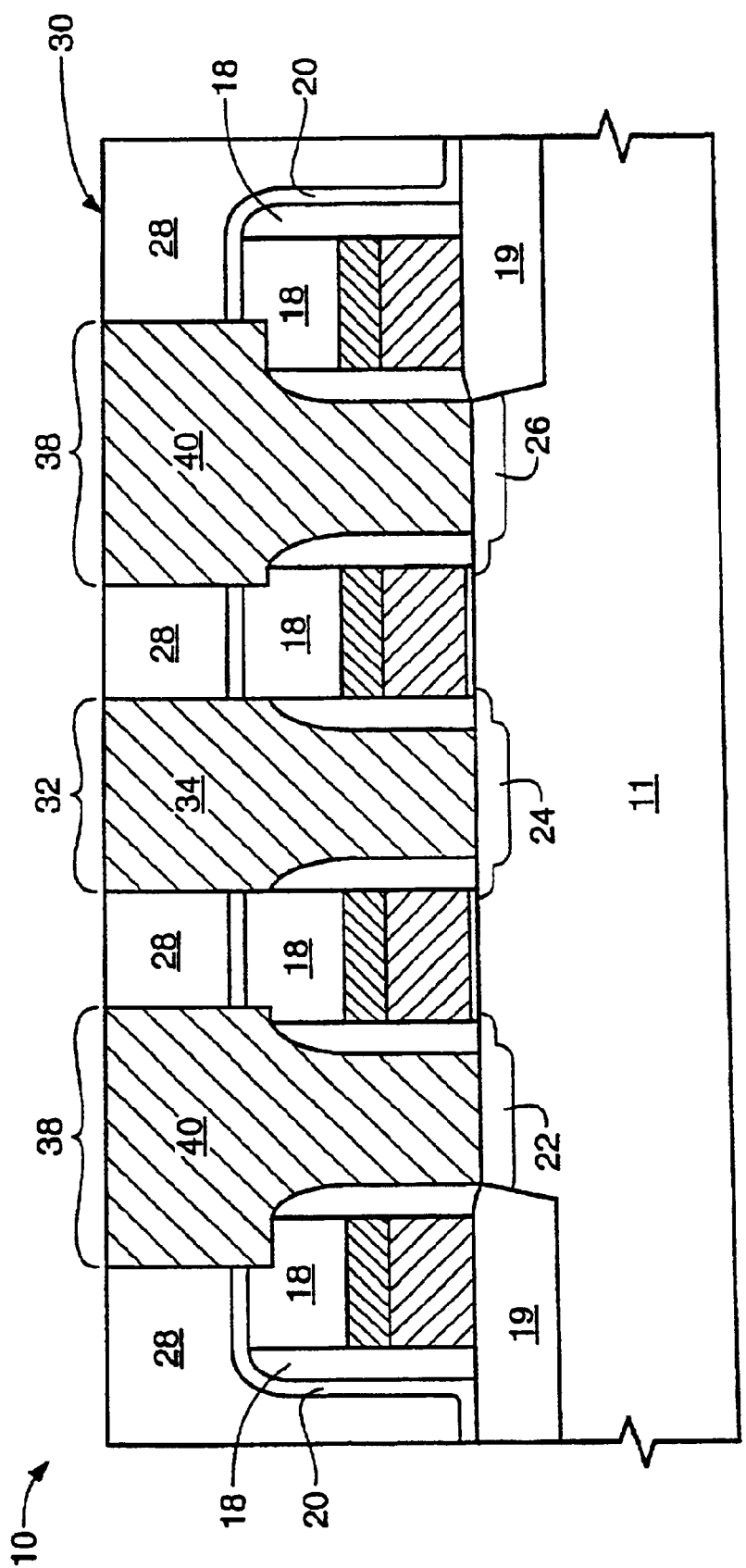
FIG. 4 is a schematic cross-section of the semiconductor wafer fragment, in accordance with the process of the present invention.

In accordance with the invention, buried capacitor contact openings/containers 38 and associated pillars 40 can be provided along with the bit line contact openings 32 and pillars 34, as seen in FIGS. 3 and 4. A first layer of electrically conductive material 36 is provided over insulating material layer 28 within first contact opening 38 and second contact opening 32 to electrically connect with first and second active regions 22, 26 and 24, respectively. First layer 36 is deposited to a thickness which fills first contact opening 38 and second contact opening 32. An example diameter for contact openings 32 and 38 is 0.2–0.25 micron. In such instance, an example preferred thickness of first layer 36 is less than 2,000 Angstroms, which is sufficient to fill the contact openings 32, 38. An example and preferred material for first layer 36 is in situ N+doped polysilicon.

Wafer fragment 10 is planarized and etched downwardly at least to upper surface 30 of insulating layer 28 to remove conductive material layer 36 thereabove. This will isolate first layer conductive material layer 36 within contact openings 32 and 38. Such planarized etching can be conducted by plasma etchback or by chemical-mechanical polishing.

Figure 5:
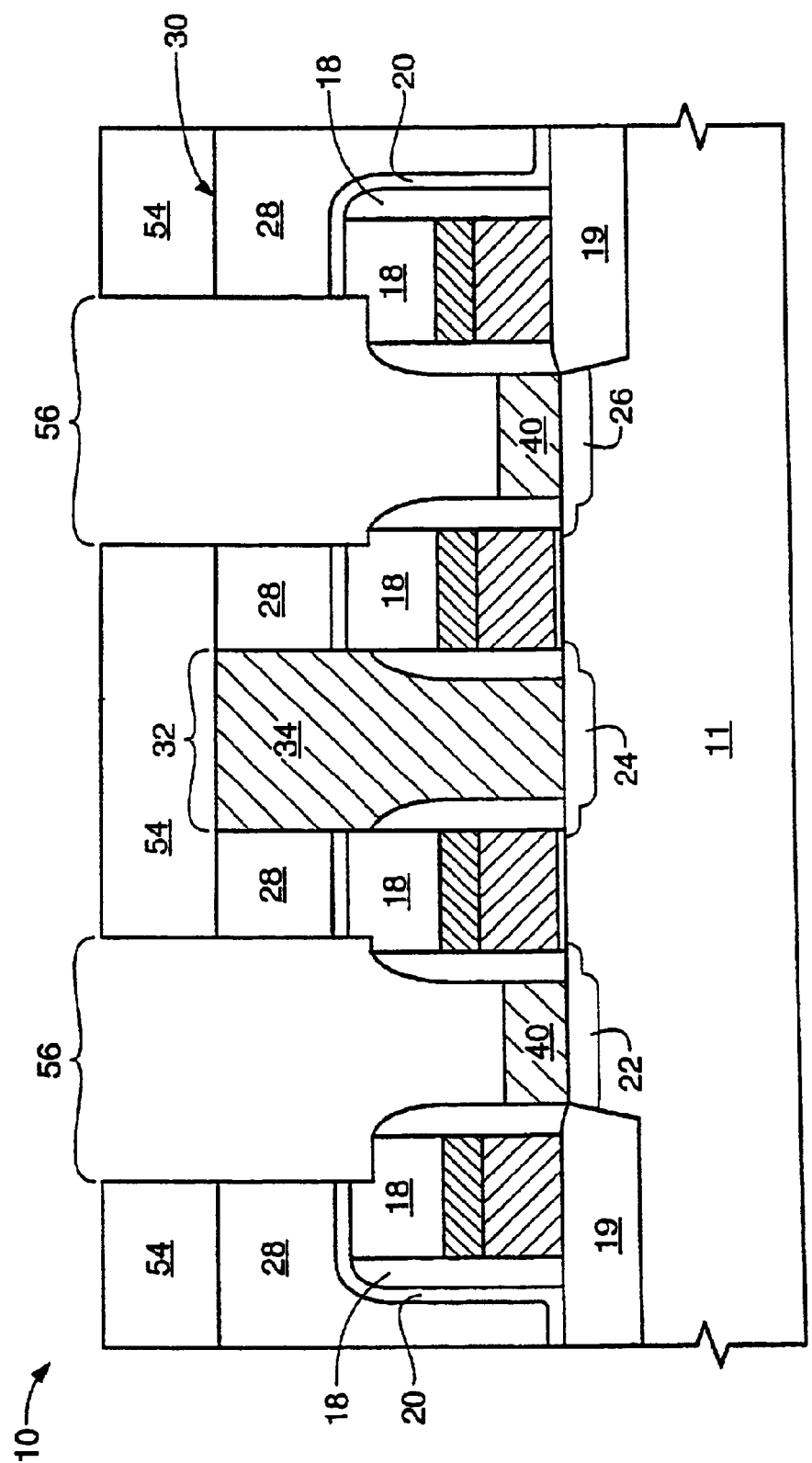
FIG. 5 is a schematic cross-section of the semiconductor wafer fragment, in accordance with the process of the present invention.

Referring to FIG. 5, the conductive material layer 36 within first contact opening 38 can be recessed further, to a level below upper surface 30 of insulating layer 28. A capacitor structure is formed at this location, as discussed below.

A layer of insulating material 54 is provided atop wafer 10. An example and preferred material for layer 54 is BPSG deposited to a thickness of approximately 10,000 Angstroms. Capacitor contact openings 56 are provided through insulating layer 54 to allow electrical connection with first active regions 22 and 26, through pillars 40.

Figure 6:
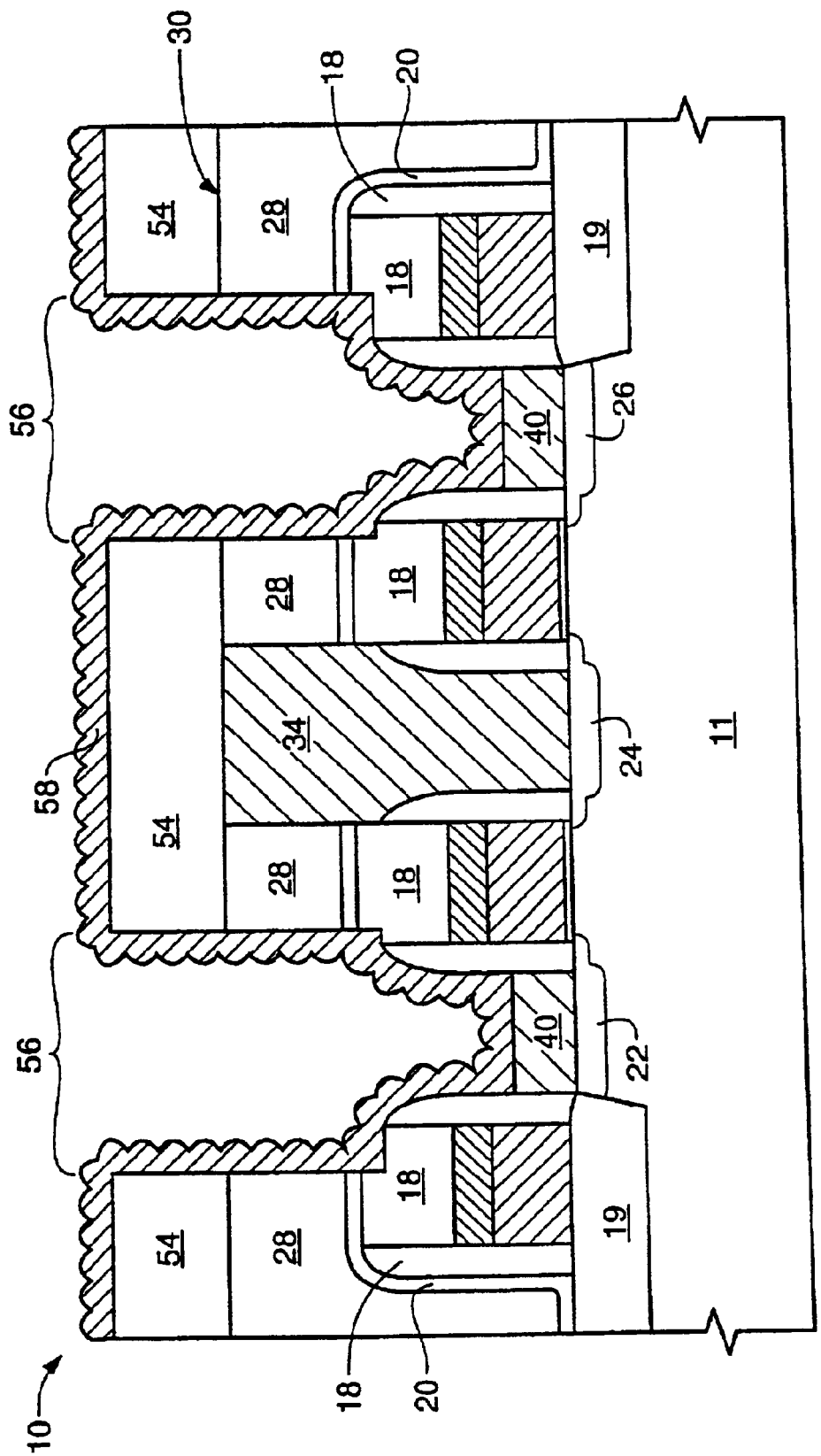
FIG. 6 is a schematic cross-section of the semiconductor wafer fragment, in accordance with the process of the present invention.

Referring to FIG. 6, a conductive material layer 58 is provided over insulating layer 54 and within capacitor contact opening 56. Conductive material layer 58 preferably comprises a storage node or storage container made from in situ phosphorous-doped HemiSpherical Grain (HSG) polysilicon.

Figure 7:
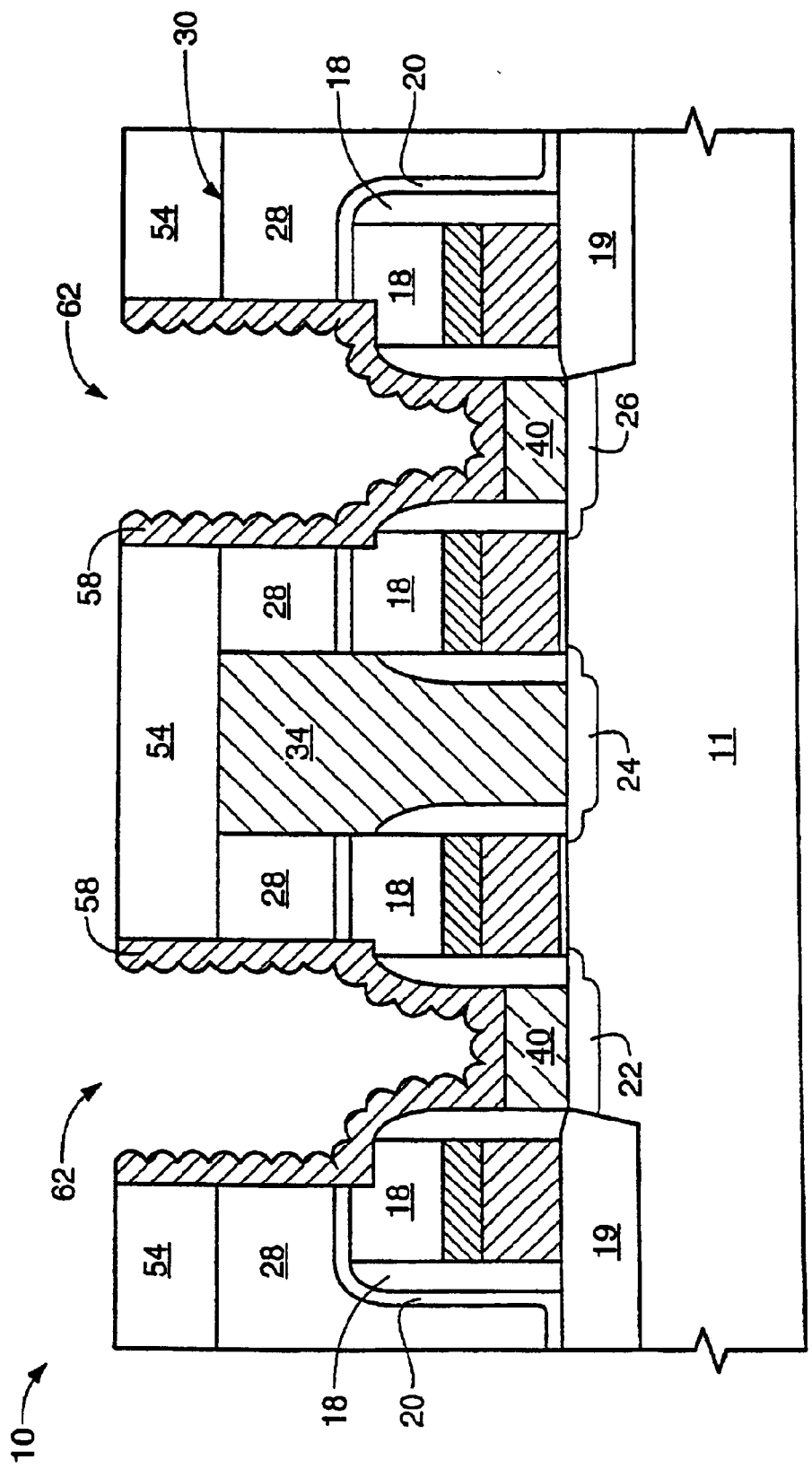
FIG. 7 is a schematic cross-section of the semiconductor wafer fragment, in accordance with the process of the present invention.

Referring to FIG. 7, CMP is preferably used to remove the conductive material layer 58 which is disposed atop insulating layer 54, thereby defining isolated storage node containers 62 (see FIG. 7). The storage node containers 62 are electrically connected to first active regions 22 and 26 through pillars 40.

Figure 8:
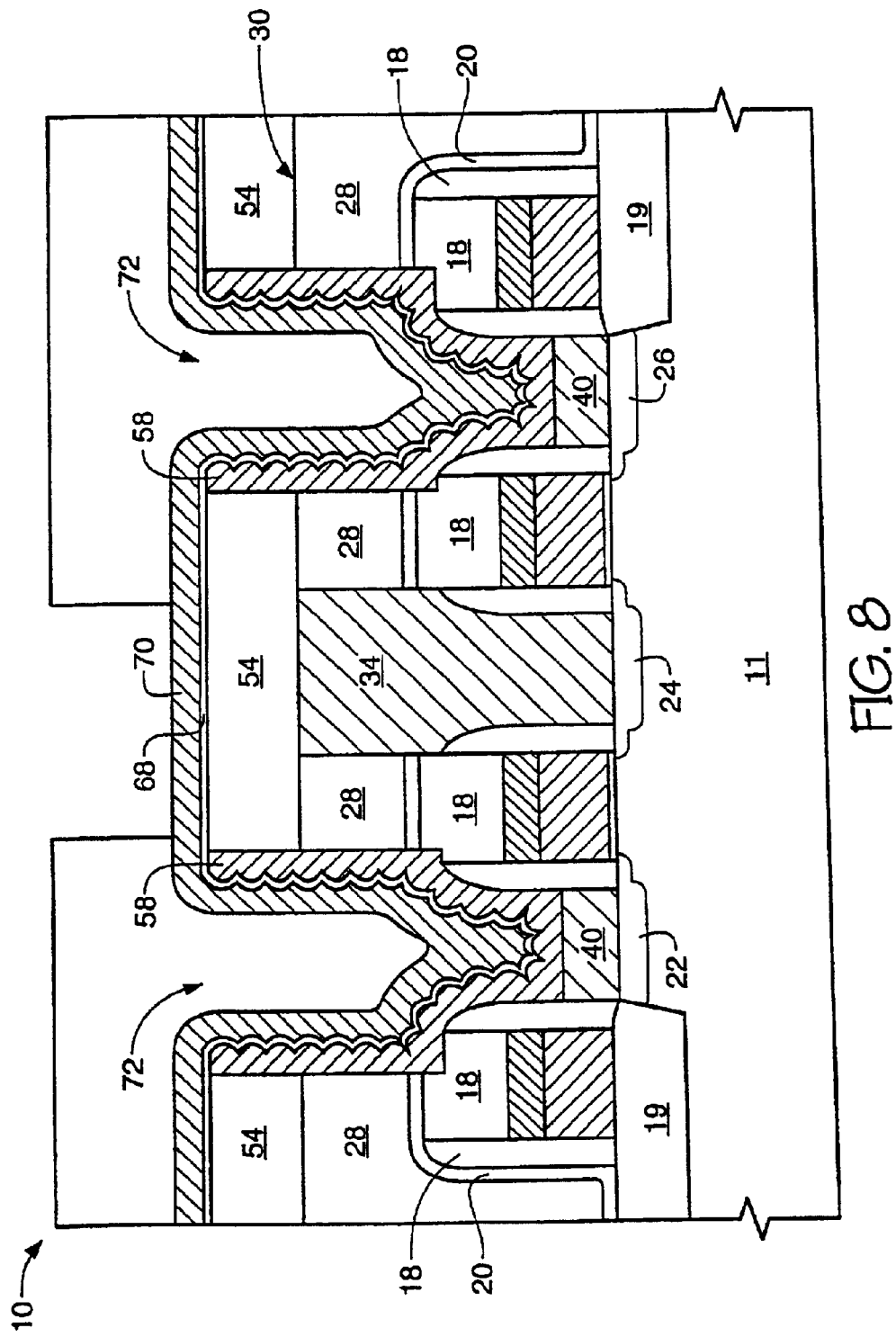
FIG. 8 is a schematic cross-section of the semiconductor wafer fragment, in accordance with the process of the present invention.

Referring to FIG. 8, a conventional or other suitable capacitor cell dielectric layer 68, such as a cell nitride layer, is conformally deposited on the wafer 10 atop isolated storage node containers 62. Specifically, insulating layer 54 is interposed between the upper surface of pillar 34 and the capacitor cell dielectric layer 68.

A conductive capacitor cell layer 70, such as a cell plate, is provided atop the capacitor cell dielectric layer 68, thereby defining an array of memory cell capacitors 72 on the wafer 10. Individual memory cell capacitors, such as the illustrated capacitors 72, of the array are thus provided within the capacitor contact openings and are defined by an outwardly projecting container structure. Cell layer 70 preferably comprises in situ phosphorous-doped polysilicon and functions as a capacitor cell plate.

Figure 9:
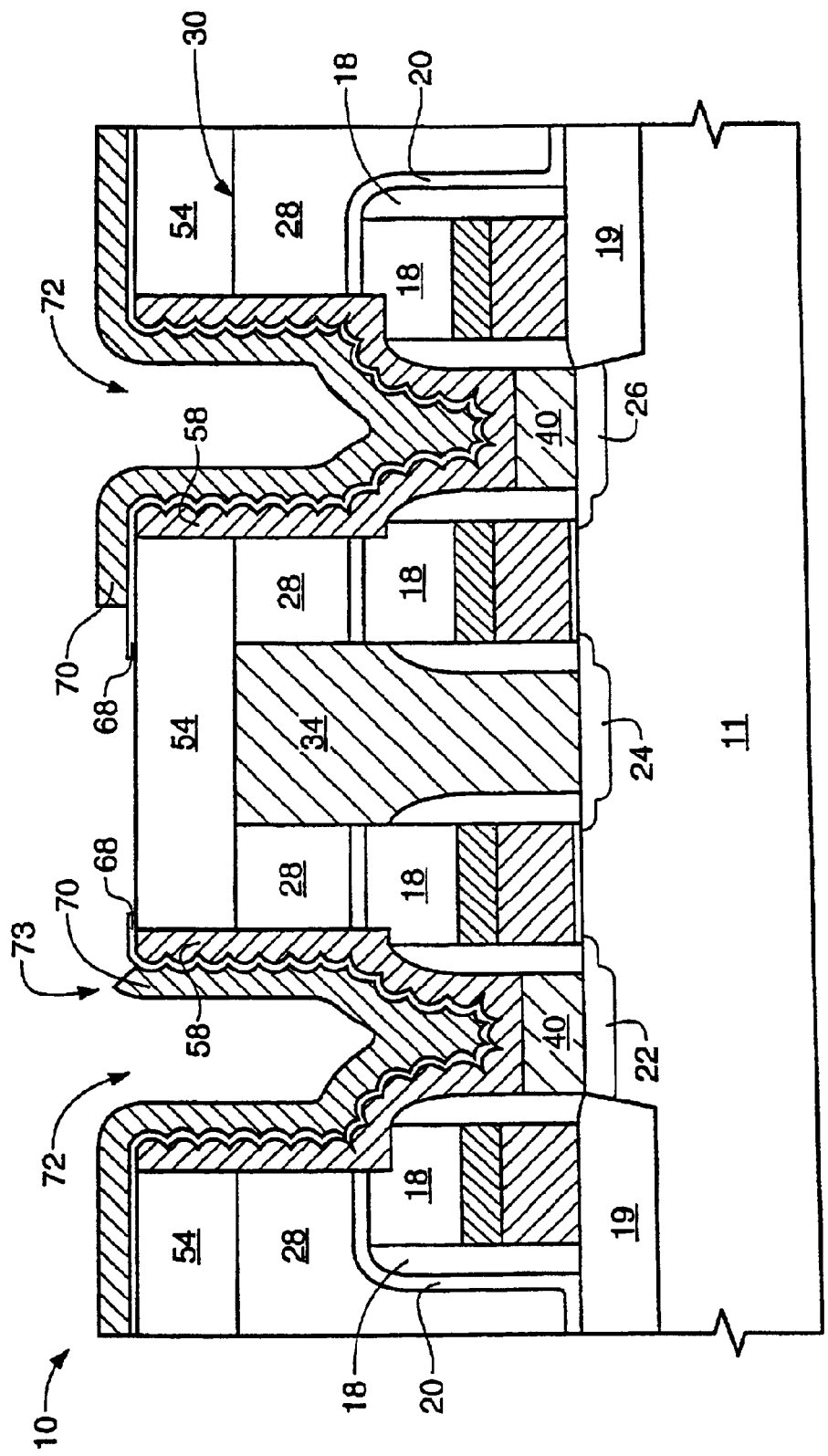
FIG. 9 is a schematic cross-section of the semiconductor wafer fragment, in accordance with the process of the present invention.

Referring to FIG. 9, cell layer 70 is then photopatterned with a layer of resist, which is intentionally illustrated herein with misalignment to account for the worst case scenario in a manufacturing environment The misalignment will make the benefits of the present invention more apparent. Alternatively, an antireflective coating is added prior to photopatterning to assist in photolithography resolution. Subsequently, layers 68 and 70 are etched together.

The etch of the cell layer 70 has an isotropic component, i.e., the etch proceeds in both horizontal and vertical directions at relatively the same rate. The polysilicon layer that comprises cell layer 70 is selectively etchable with respect to the cell dielectric layer 68. Hence, the cell dielectric layer 68 is not etched at the same rate and an overetch of the cell layer 70 results in an undercut profile. One consequence of the undercut of cell layer 70 is that, with a worst case scenario, photolithography may result in a misalignment edge 73, as seen in FIG. 9, wherein the cell layer 70 is isotropically etched back past the upper edge of the conductive material layer 58.

Figure 10:
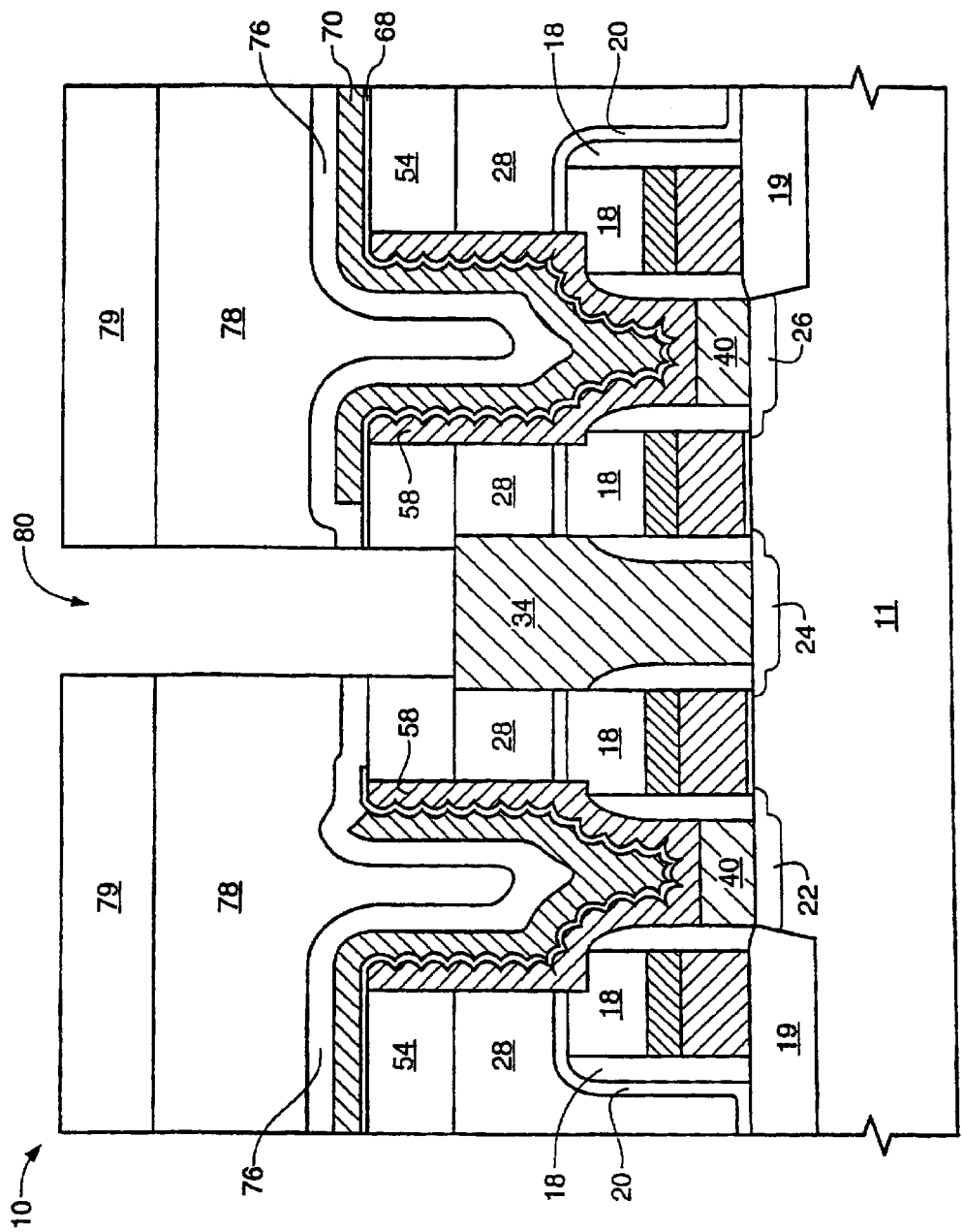
FIG. 10 is a schematic cross-section of the semiconductor wafer fragment, in accordance with the process of the present invention.

One reason for undercutting into the cell layer 70 is to provide more of a process margin for the future bit line contact opening 80 (see FIG. 10). The undercut profile helps to prevent the conductive polysilicon which forms cell layer 70 from projecting into the bit line contact opening 80 and thereby causing a short. This potential short is an increasing problem as the geometries of the DRAM cell become smaller and smaller. Therefore, one advantage of this step is an increased bit line contact opening 80 to cell layer 70 space and hence, a method to isolate the conductive edges of cell layer 70.

However, the corresponding disadvantage is that the cell layer 70 is etched past the conductive material layer 58, which leads to a low-level defect density of current leakage between the conductive material layer 58 and cell layer 70 at the misalignment edge 73. This current leakage results in loss of stored charge in the DRAM cell, which leads to data retention errors. Additionally, the loss of stored charge may be aggravated by possible damage of the exposed cell dielectric layer 68 in the misalignment edge 73 or region.

As shown in FIG. 10, an electrically insulative layer 76, such as TEOS, is blanket deposited atop the wafer 10 (and, therefore, covers cell layer 70) to a thickness from about 150 Angstroms to about 1,500 Angstroms, preferably 500 Angstroms. The purpose of such an insulative layer 76 is to cover both the exposed corner of the conductive material layer 58 and any damaged cell dielectric layer 68. Further, the blanket TEOS film or layer 76 is superior to the use of a nitride film as it also allows hydrogen to diffuse through it and, consequently, does not prevent passivation by hydrogen of the FETs during alloy.

Continuing the process flow, FIG. 10 illustrates a layer of insulating material 78 overlying the electrically insulative layer 76 or barrier layer and underlying layers and memory cell capacitors 72. The layer of insulating material 78 is preferably comprised of BPSG. Alternatively, a deposited anti-reflective coating (not shown) may be added atop the BPSG insulating material layer 78 for increased photolithography resolution. The wafer 10 is coated with a layer of resist 79 and is patterned.

Preliminary bit line contact openings 80 are provided through overlying BPSG insulating material layer 78, TEOS insulative layer 76 and second BPSG insulating layer 54 down to the pillar 34. The anisotropic plasma etch used to produce contact opening 80 is followed by a pre-metal clean, also known as a wet etch as oxide material is isotropically removed. The pre-metal clean/wet etch removes any anti-reflective coating (DARC) remaining on the top surface of the BPSG insulating material layer 78 and cleans the bottom of the contact opening 80.

Typically, the process incidentally would move out laterally when the wet etch process hits the cell dielectric layer 68. However, the TEOS insulative layer 76 deposited atop of the wafer 10 after the cell layer 70 has been etched serves to substantially eliminate any preferential wet etching along the seam of the cell dielectric layer 68 and BPSG insulating material layer 78, which would occur if the TEOS insulative layer 76 had not been deposited.

Without the TEOS insulative layer 76, when the pre-metal clean/wet etch hits the cell dielectric layer 68, an enhanced etch rate would occur along the interface with the BPSG insulating material layer 78. This enhanced etch rate is due to stress and dopant "pile-up" from the BPSG insulaing material layer 78 and out-diffusion from the heavily doped exposed cell layer 70. Higher out-diffusion and higher phosphorous concentration from the exposed cell layer 70 leads to an enhanced wet etch rate. This will be exacerbated by subsequent wet cleans prior to contact metal deposition, which can ultimately lead to bit contact-to-cell layer 70 shorts.

The presence of the TEOS insulative layer 76 moves the stress away from the nitride/BPSG interface to the TEOS/BPSG interface. The result is that the cell layer 70 is no longer exposed during the pre-metal clean/wet etch. The TEOS insulative layer 76 prevents dopant mixing or "pile up" (an increase in the concentration of dopants in a particular location). Thus, the TEOS insulative layer 76 provides a stress buffer and dopant barrier in the form of a TEOS film that is deposited after the capacitor cell layer 70 is etched and cleaned.

The addition of a TEOS insulative layer 76 buffers the stress as well as eliminates dopant mixing between the highly phosphorous doped polycrystalline silicon forming the capacitor cell layer 70 and the heavily doped BPSG insulating material layer 78 and, therefore, provides a method of reducing stress-induced wet etching along the BPSG/nitride interface in a DRAM capacitor to eliminate bit contact-to-cell layer 70 shorting.

Subsequently, a digit line layer, such as metal or conductively doped polysilicon, is provided atop the wafer 10 and within the complete bit line contact openings 80, and thus electrically connects with pillar 34 for establishing electrical connection with active region 24.

While the particular process as herein shown and disclosed in detail is fully capable of obtaining the objects and advantages hereinbefore stated, it is to be understood that it is merely illustrative of the presently preferred embodiments of the invention and that no limitations are intended to the details of construction or design herein shown other than as described in the appended claims.

One having ordinary skill in the art will realize that even though a DRAM was used as the illustrative example, the process is equally applicable to other semiconductor devices.

What is claimed is:

1. A DRAM circuit comprising:
   a substrate having an active region thereon and a capacitor structure disposed above the active region, the capacitor structure including a storage node, a dielectric layer overlying the storage node, and a conductive cell plate overlying the dielectric layer, each of the dielectric layer and the conductive cell plate having an end portion proximate a conductive contact, the conductive contact extending downward and adjacently beside the capacitor structure, the end portion of the dielectric layer extending closer to the conductive contact than the end portion of the conductive cell plate;
   a first TEOS layer disposed proximate the storage node;
   a second TEOS layer disposed over the capacitor structure and encasing the end portions of the dielectric layer and the conductive cell plate, the second TEOS layer disposed between the capacitor structure and the conductive contact; and
   a doped BPSG layer disposed over the second TEOS layer, the conductive contact extending through the BPSG layer and the second TEOS layer.

2. The DRAM circuit of claim 1, wherein each of the storage node and the conductive cell plate is heavily doped with dopants.

3. The DRAM circuit of claim 1, wherein each of the storage node and the conductive cell plate comprises a phosphorous-doped polysilicon.

4. The DRAM circuit of claim 1, wherein the dielectric layer comprises a capacitor cell dielectric layer.

5. The DRAM circuit of claim 1, wherein the dielectric layer comprises a nitride layer.

6. The DRAM circuit of claim 1, wherein the capacitor structure comprises a container-shaped capacitor.

7. The DRAM circuit of claim 1, wherein the second TEOS layer is a dopant barrier between the capacitor structure and the BPSG layer.

8. The DRAM circuit of claim 1, wherein the first TEOS layer is configured to prevent diffusion of contaminants into the active region.

9. The DRAM circuit of claim 1, wherein the first TEOS layer comprises a thickness of about 100 Å to about 250 Å.

10. A semiconductor memory device comprising:
    a semiconductor substrate having an active region thereon and a capacitor structure formed above the active region, the capacitor structure including a first conductive layer, a second conductive layer, and a dielectric layer, the dielectric layer disposed between the first and second conductive layers, each of the dielectric layer and the first and second conductive layers having an end portion proximate a conductive contact, the conductive contact extending downward and adjacently beside the capacitor structure, the end portion of the dielectric layer extending closer to the conductive contact than the end portion of each of the first conductive layer and said the second conductive layer;

a diffusion barrier proximate the first conductive layer and configured to prevent diffusion of contaminants into the active region;

a TEOS layer disposed over the capacitor structure and encasing the end portions of the dielectric layer and each of the first conductive layer and the second conductive layer, the TEOS layer disposed between the capacitor structure and the conductive contact; and a doped BPSG layer disposed over the TEOS layer, the conductive contact extending through the BPSG layer and the TEOS layer.

11. The device of claim 10, wherein the conductive contact comprises at least one of metal and conductively doped polysilicon.

12. The device of claim 10, wherein the conductive contact comprises a digit line.

13. The device of claim 10, wherein each of the first conductive layer and the second conductive layer is heavily doped with dopants.

14. The device of claim 10, wherein each of the first conductive layer and the second conductive layer comprises a phosphorous-doped polysilicon.

15. The device of claim 10, wherein the dielectric layer comprises a capacitor cell dielectric layer.

16. The device of claim 10, wherein the dielectric layer comprises a nitride layer.

17. The device of claim 10, wherein the capacitor structure comprises a container-shaped capacitor.

18. The device of claim 10, wherein the TEOS layer is a dopant barrier between the capacitor structure and the BPSG layer.

19. The semiconductor memory device of claim 10, wherein the diffusion barrier comprises a nitride layer or TEOS layer.

20. The semiconductor memory device of claim 10, wherein the diffusion barrier comprises a thickness of about 100 Å to about 250 Å.

* * * * *

UNITED STATES PATENT AND TRADEMARK OFFICE
CERTIFICATE OF CORRECTION

PATENT NO. : 6,894,332 B2  
APPLICATION NO. : 09/943778  
DATED : May 17, 2005  
INVENTOR(S) : Kunal R. Parekh, Charles H. Dennison and Jeffrey W. Honeycutt It is certified that error appears in the above-identified patent and that said Letters Patent is hereby corrected as shown below:

On the title page:
In item (62) titled Related U.S. Application Data, 2$^{nd}$ line, change "1999." to --1999, now U.S. Pat. No. 6,468,859, issued Oct. 22, 2002.--

In the specification:
COLUMN 4, LINE 36, change "environment The misalignment" to --environment. The misalignment--
COLUMN 5, LINE 11, change "exposed comer" to --exposed corner--
COLUMN 5, LINE 48, change "BPSG insulaing" to --BPSG insulating--

Signed and Sealed this

Twenty-seventh Day of November, 2007

JON W. DUDAS  
*Director of the United States Patent and Trademark Office*